US008724032B2

(12) United States Patent
Tang

(10) Patent No.: US 8,724,032 B2
(45) Date of Patent: May 13, 2014

(54) ELECTRONIC DEVICE WITH VIDEO IN/OUT SWITCHING FUNCTION

(75) Inventor: Xing-Hua Tang, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 0 days.

(21) Appl. No.: 13/531,420

(22) Filed: Jun. 22, 2012

(65) Prior Publication Data

US 2013/0286290 A1 Oct. 31, 2013

(30) Foreign Application Priority Data

Apr. 27, 2012 (CN) .......................... 2012 1 0128539

(51) Int. Cl.

| | |
|---|---|
| ***H04N 5/268*** | (2006.01) |
| ***H04N 5/765*** | (2006.01) |
| ***H04N 9/80*** | (2006.01) |
| ***H03K 19/173*** | (2006.01) |
| ***G06F 7/38*** | (2006.01) |

(52) U.S. Cl.
USPC .............. 348/705; 386/200; 386/311; 326/38

(58) Field of Classification Search
None
See application file for complete search history.

(56) References Cited

U.S. PATENT DOCUMENTS

| | | | | |
|---|---|---|---|---|
| 7,242,844 | B1 * | 7/2007 | Ueno | 386/200 |
| 2003/0210071 | A1 * | 11/2003 | Fowler | 326/38 |
| 2012/0287344 | A1 * | 11/2012 | Choi et al. | 348/705 |

* cited by examiner

*Primary Examiner* — Jefferey Harold
*Assistant Examiner* — Sean Haiem
(74) *Attorney, Agent, or Firm* — Novak Druce Connolly Bove + Quigg LLP

(57) ABSTRACT

An electronic device with video in/out switching function using one port when connected with an external electronic apparatus includes a video switch circuit; an LCD; a processing unit, to decode and output video signals to the LCD; and an interface unit. In a video in mode, the video switch circuit connects the processing unit to the external electronic apparatus via the interface unit, thereby video signals from the external electronic apparatus are decoded and then output to the LCD. In a video out mode, the video switch circuit connects a video source to the external electronic via the interface unit, thereby video signals from the video source are output to the external electronic apparatus.

2 Claims, 3 Drawing Sheets

ELECTRONIC DEVICE WITH VIDEO IN/OUT SWITCHING FUNCTION

BACKGROUND

1. Technical Field

The present disclosure relates to electronic devices with video in/out switching function, and more particularly to an electronic device with a video in/out switching function using only one port.

2. Description of Related Art

DVD players, televisions, and other electronic products can be connected together via video in/out ports. Video in ports are separate from video out ports and each are dedicated to their single particular function, which requires more parts and takes up more space.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments.

DETAILED DESCRIPTION

Embodiments of the present disclosure will be described below, with reference to the accompanying drawings.

Figure 1:
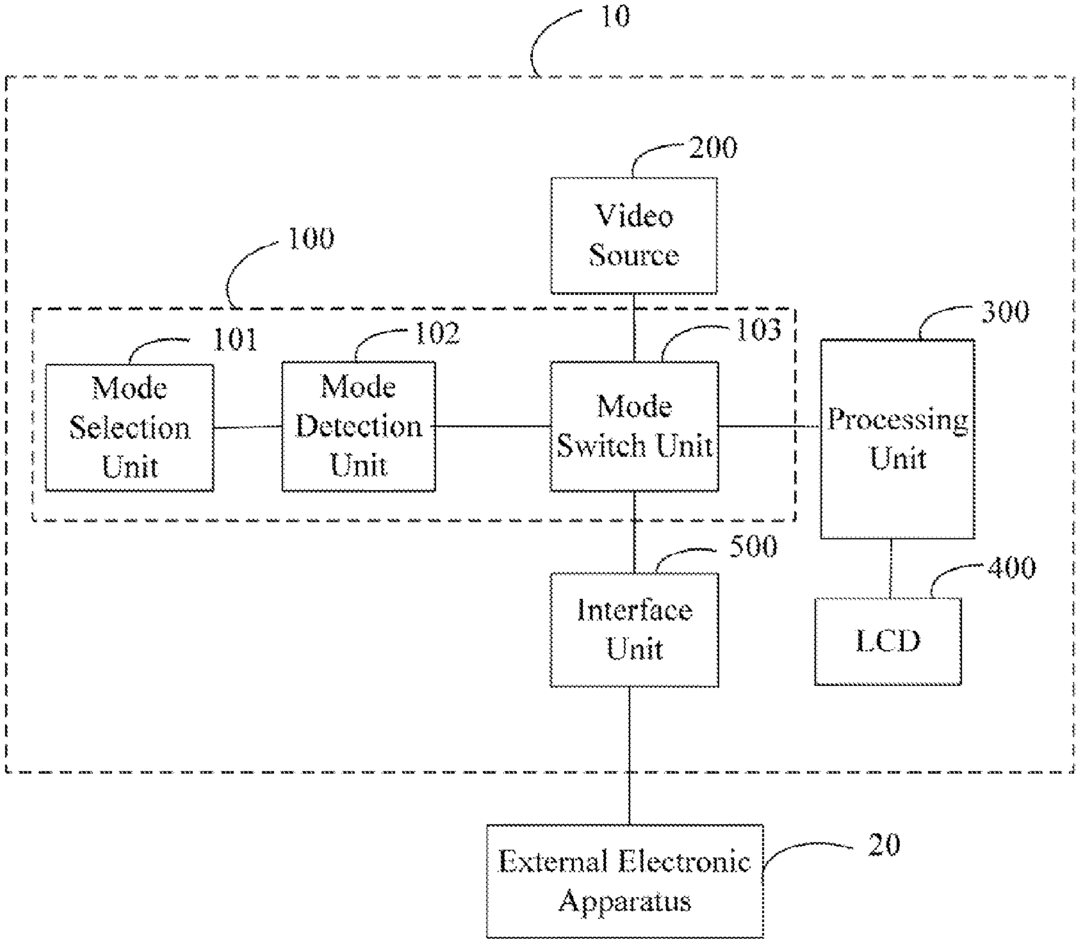
FIG. 1 is a schematic circuit diagram of an embodiment of an electronic device with video in/out switching function in accordance with the present disclosure.

Referring to FIG. 1, an electronic device 10 with a video in/out switching function is connected to an external electronic apparatus 20 to output video signals to the external electronic apparatus 20 or receive video signals from the external electronic apparatus 20. The electronic device 10 includes a video switch circuit 100, a video source 200, a processing unit 300, a liquid crystal display (LCD) 400, and an interface unit 500. The processing unit 300 decodes and outputs video signals to the LCD 400.

In a video in mode, the video switch circuit 100 connects the processing unit 300 to the external electronic apparatus 20 via the interface unit 500, thereby video signals from the external electronic apparatus 20 may be decoded and then output to the LCD 400. In a video out mode, the video switch circuit 100 connects the video source 200 to the external electronic apparatus 20 via the interface unit 500, thereby video signals from the video source 200 are output to the external electronic apparatus 20.

The video switch circuit 100 includes a mode selection unit 101, a mode detection unit 102, and a mode switch unit 103.

The mode selection unit 101 can be used to select either the video in mode or the video out mode. The mode selection unit 101 may comprise, for example, a key or button with two working states respectively corresponding to the video in mode and the video out mode.

The mode detection unit 102 detects user operation on the mode selection unit 101, generates a video input signal when the video in mode is selected, and generates a video output signal when the video out mode is selected.

When receiving the video input signal, the mode switch unit 103 controls connecting the processing unit 300 to the external electronic apparatus 20 via the interface unit 500, thereby video signals received from the external electronic apparatus 20 can be decoded by the processing unit 300 and output to the LCD 400. When receiving the video output signal, the mode switch unit 103 controls connecting the video source 200 to the external electronic apparatus 20 via the interface unit 500, thereby video signals from the video source 200 are output to the external electronic apparatus 20.

In a preferred embodiment, the electronic device 10 is a portable DVD player and the external electronic apparatus 20 is a TV. The video source 200 is a DVD source having CY mode signals and CVBS mode signals. The mode selection unit 101 is a switch. The mode detection unit 102 generates a logic high (level) when the switch is turned off, and a logic low (level) when the switch is turned on. Similarly, the mode detection unit 102 generates a logic low (level) when the switch is turned off, and a logic high (level) when the switch is turned on.

In a preferred embodiment, the mode switch unit 103 is a three pole double throw switch, with contacts a, b, c, 1, 2, 3, 4, 5, and 6. Contacts 1 and 3 are connected together, and contact 5 is suspended.

Figure 2:
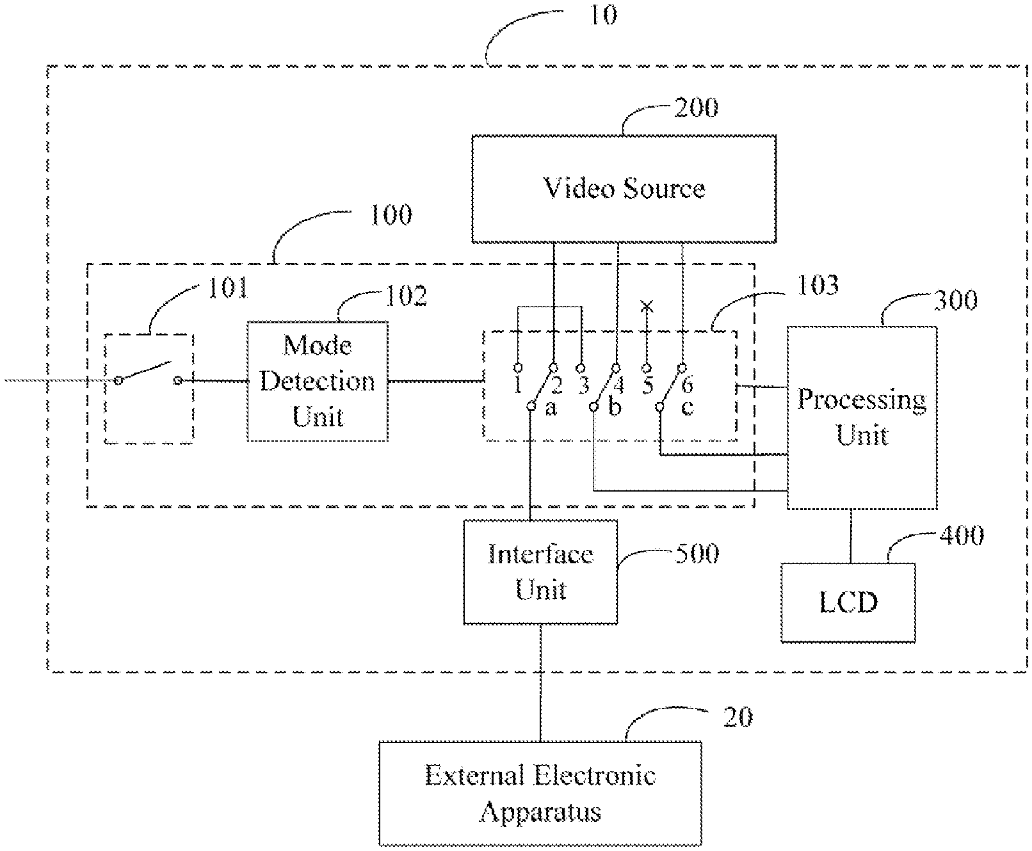
FIG. 2 is a schematic circuit diagram of a first state of the electronic device with video in/out switching function in FIG. 1.

When receiving the logic low, See FIG. 2, contact a is connected to contact 2, contact b is connected to contact 4, and contact c is connected to contact 6. Connections of contacts b and 4, contacts c and 6 make the video source 200 connected to the processing unit 300 directly, for outputting the CY mode signals of the video source 200 to the processing unit 300, thereby to the LCD 400. Connection of contacts a and 2 makes the video source 200 connected to the external electronic 20 via the interface unit 500, for outputting the CVBS mode signals of the video source 200 to the external electronic 20.

Figure 3:
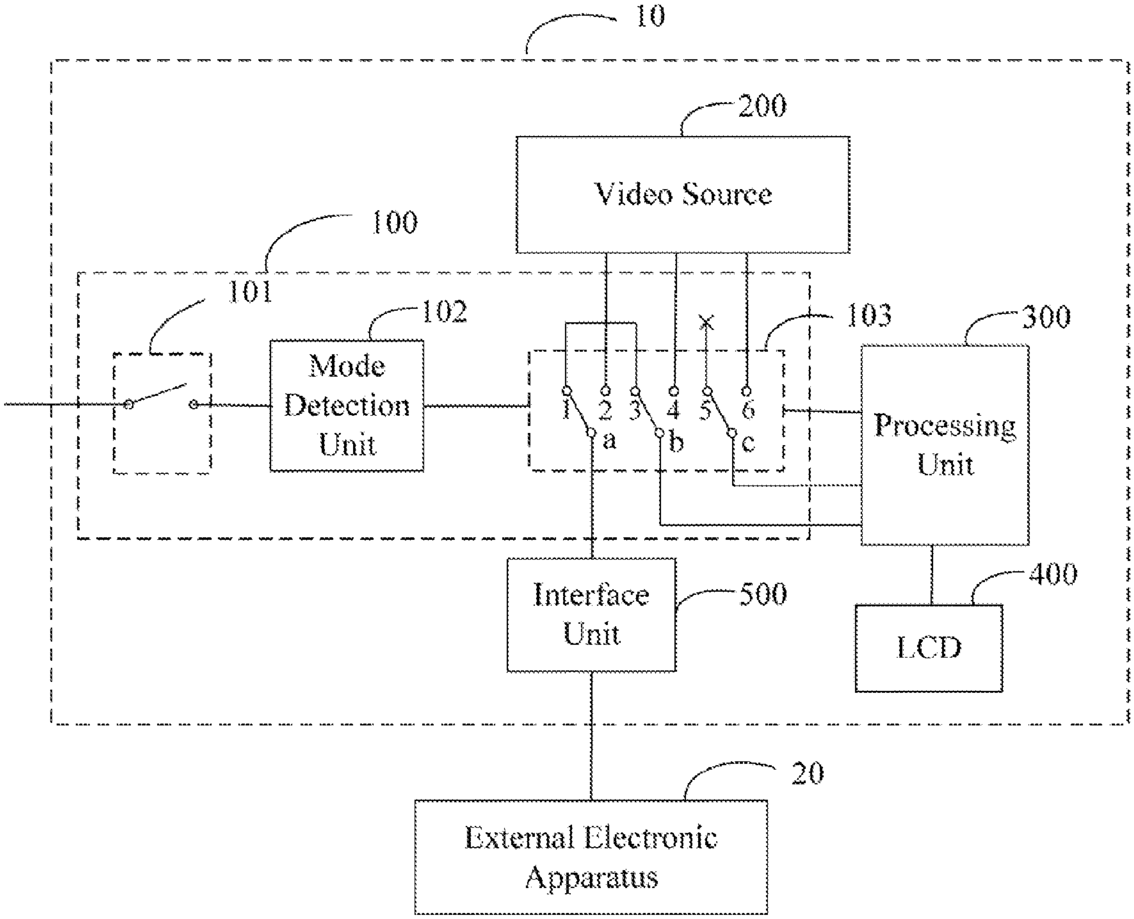
FIG. 3 is a schematic circuit diagram of a second state of the electronic device with video in/out switching function in FIG. 1.

When receiving the logic high, see FIG. 3, contact a is connected to contact 1, contact b is connected to contact 3, and contact c is connected to contact 5, thereby contact a is connected to contact b, contacts c and 5 are suspended. Connection of contacts a and b makes the external electronic 20 be connected to the processing unit 300 via the interface unit 500, for outputting the video signals from the external electronic 20 to the LCD 400.

Similarly, when receiving the logic high, See FIG. 2, contact a is connected to contact 2, contact b is connected to contact 4, and contact c is connected to contact 6. Connections of contacts b and 4, contacts c and 6 make the video source 200 connected to the processing unit 300 directly, for outputting the CY mode signals of the video source 200 to the processing unit 300, thereby to the LCD 400. Connection of contacts a and 2 makes the video source 200 connected to the external electronic 20 via the interface unit 500, for outputting the CVBS mode signals of the video source 200 to the external electronic 20.

When receiving the logic low, see FIG. 3, contact a is connected to contact 1, contact b is connected to contact 3, and contact c is connected to contact 5, thereby contact a is connected to contact b, contacts c and 5 are suspended. Connection of contacts a and b makes the external electronic 20 be connected to the processing unit 300 via the interface unit 500, for outputting the video signals from the external electronic 20 to the LCD 400.

The electronic device 10 realizes the switching of video in/out function through operating the button, thereby only one port is needed to plug cables in.

Although the features and elements of the present disclosure are described as embodiments in particular combinations, each feature or element can be used alone or in other various combinations within the principles of the present disclosure to the full extent indicated by the broad general meaning of the terms in which the appended claims are expressed.

What is claimed is:

1. An electronic device with video in/out switching function using one port, when connected with an external electronic apparatus, the electronic device comprising:

a video switch circuit;

an LCD;

a processing unit, to decode and output video signals to the LCD; and an interface unit;

wherein, in a video in mode, the video switch circuit connects the processing unit to the external electronic apparatus via the interface unit, thereby video signals from the external electronic apparatus are decoded and then output to the LCD; in a video out mode, the video switch circuit connects a video source to the external electronic apparatus via the interface unit, thereby video signals from the video source are output to the external electronic apparatus, wherein the video source is a DVD source outputting CY mode signals and CVBS mode signals, the mode switch unit is a three pole double throw switch, with contacts a, b, c, 1, 2, 3, 4, 5, and 6, contacts 1 and 3 are connected together, and contact 5 is suspended;

when receiving the logic low, contact a is connected to contact 2, contact b is connected to contact 4, and contact c is connected to contact 6, connections of contacts b and 4, contacts c and 6 make the video source connected to the processing unit directly, for outputting the CY mode signals of the video source to the processing unit, thereby to the LCD, connection of contacts a and 2 makes the video source connected to the external electronic via the interface unit, for outputting the CVBS mode signals of the video source to the external electronic; and when receiving the logic high, contact a is connected to contact 1, contact b is connected to contact 3, and contact c is connected to contact 5, thereby contact a is connected to contact b, contacts c and 5 are suspended, connection of contacts a and b makes the external electronic be connected to the processing unit via the interface unit, for outputting video signals from the external electronic to the LCD.

2. An electronic device with video in/out switching function using one port, when connected with an external electronic apparatus, the electronic device comprising:

a video switch circuit;

an LCD;

a processing unit, to decode and output video signals to the LCD; and an interface unit;

wherein, in a video in mode, the video switch circuit connects the processing unit to the external electronic apparatus via the interface unit, thereby video signals from the external electronic apparatus are decoded and then output to the LCD; in a video out mode, the video switch circuit connects a video source to the external electronic apparatus via the interface unit, thereby video signals from the video source are output to the external electronic apparatus wherein the video source is a DVD source outputting CY mode signals and CVBS mode signals, the mode switch unit is a three pole double throw switch, with contacts a, b, c, 1, 2, 3, 4, 5, and 6, contacts 1 and 3 are connected together, and contact 5 is suspended;

when receiving the logic high, contact a is connected to contact 2, contact b is connected to contact 4, and contact c is connected to contact 6, connections of contacts b and 4, contacts c and 6 make the video source connected to the processing unit directly, for outputting the CY mode signals of the video source to the processing unit, thereby to the LCD, connection of contacts a and 2 make the video source connected to the external electronic via the interface unit, for outputting the CVBS mode signals of the video source to the external electronic; and when receiving the logic low, contact a is connected to contact 1, contact b is connected to contact 3, and contact c is connected to contact 5, thereby contact a is connected to contact b, contacts c and 5 are suspended, connection of contacts a and b makes the external electronic be connected to the processing unit via the interface unit, for outputting video signals from the external electronic to the LCD.

* * * * *